(12) United States Patent
Mishima

(10) Patent No.: US 10,667,445 B2
(45) Date of Patent: May 26, 2020

(54) POSITION RECOGNITION APPARATUS FOR PRINTED CIRCUIT BOARD, POSITION RECOGNITION AND PROCESSING APPARATUS, AND PRINTED CIRCUIT BOARD MANUFACTURING METHOD

(71) Applicant: NIPPON MEKTRON, LTD., Minato-ku, Tokyo (JP)

(72) Inventor: Kenichi Mishima, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 127 days.

(21) Appl. No.: 16/037,541

(22) Filed: Jul. 17, 2018

(65) Prior Publication Data

US 2019/0069454 A1 Feb. 28, 2019

(30) Foreign Application Priority Data

Jul. 20, 2017 (JP) ................ 2017-140849

(51) Int. Cl.
| | |
|---|---|
| *G06K 9/00* | (2006.01) |
| *H05K 13/00* | (2006.01) |
| *H05K 1/18* | (2006.01) |
| *H05K 3/30* | (2006.01) |
| *H01L 33/48* | (2010.01) |

(Continued)

(52) U.S. Cl.
CPC ..... *H05K 13/0015* (2013.01); *G01N 21/6456* (2013.01); *G01N 21/6489* (2013.01); *G06T 7/001* (2013.01); *G06T 7/0004* (2013.01); *G06T 7/0008* (2013.01); *G06T 7/66* (2017.01); *H01L 33/48* (2013.01); *H05K 1/181* (2013.01); *H05K 3/303* (2013.01); *H05K 13/046* (2013.01); *H05K 13/0815* (2018.08); *G01N 2201/062* (2013.01); *G06T 2207/20132* (2013.01); *G06T 2207/30141* (2013.01); *H05K 2201/10106* (2013.01);

(Continued)

(58) Field of Classification Search
None
See application file for complete search history.

(56) References Cited

FOREIGN PATENT DOCUMENTS

| | | |
|---|---|---|
| JP | 2014135482 A | 7/2014 |
| JP | 5903563 B2 | 4/2016 |

OTHER PUBLICATIONS

Komaike et al. (Translation of JP 2014-135482, the applicant has provided the original document in Japanese) (Year: 2014).*

* cited by examiner

*Primary Examiner* — Soo Jin Park
(74) *Attorney, Agent, or Firm* — Cantor Colburn LLP

(57) ABSTRACT

There are provided a position recognition apparatus for printed circuit board (PCB), a position recognition and processing apparatus, and a printed circuit board manufacturing method. A position recognition apparatus for PCB configured to recognize a mounting position of an LED package on a PCB, the LED package being including a phosphor emitting fluorescence in operation, includes: an illuminating means configured to irradiate the PCB with light containing a blue component; an observation filter configured to selectively pass at least blue light of reflected light from the PCB and fluorescence from the phosphor and cut light in a wavelength region longer than a wavelength of the blue light; an imaging means configured to capture an image of the light passed by the observation filter; and an image processing means configured to calculate a position of the phosphor on the PCB, based on image data captured by the imaging means.

14 Claims, 10 Drawing Sheets

(51) Int. Cl.
  *H05K 13/04* (2006.01)
  *G06T 7/00* (2017.01)
  *G01N 21/64* (2006.01)
  *G06T 7/66* (2017.01)
  *H05K 13/08* (2006.01)
(52) U.S. Cl.
  CPC .............. *H05K 2201/10121* (2013.01); *H05K 2203/166* (2013.01)

ND PROCESSING
APPARATUS, AND PRINTED CIRCUIT
BOARD MANUFACTURING METHOD

CROSS-REFERENCE TO RELATED APPLICATIONS

The present application claims priority under 35 U.S.C. § 119 to Japanese patent application No. 2017-140849 filed on Jul. 20, 2017 the content of which is incorporated herein by reference.

BACKGROUND OF THE INVENTION

1. Field of the Invention

The present invention relates to a position recognition apparatus for printed circuit board, a position recognition and processing apparatus, and a printed circuit board manufacturing method.

2. Description of the Related Art

As various illumination devices, LED illumination device using a Light Emitting Diode (LED) element is in wide spread use in recent years. Among them, a technique of mounting a surface-mount type LED package on a printed circuit board and mounting a lens on the same printed circuit board is disclosed, for example, in Patent Documents 1, 2.

In a recognition processing apparatus in Patent Document 1, in order to eliminate the optical axis deviation in mounting the lens on the printed circuit board, an illuminating lamp irradiates the LED package on the printed circuit board with blue light, the blue light is reflected from a mold part of the LED package, and weak visible light is generated from a phosphor. The light reflected from the mold part and the fluorescence from the phosphor is made incident on a camera, thereby making it possible to recognize the position of the phosphor from the difference in brightness in their image.

Besides, Patent Document 2 discloses a configuration in which a first illumination light source part that emits red light, a second illumination light source part that similarly emits red light, and a third illumination light source part that emits white light are provided. Further, in a range corresponding to the third illumination light source part, a first filter converting the white light into the blue light is provided. Further, at a position corresponding to an opening part of an illumination printed circuit board, a second filter is provided which has characteristics of not transmitting the reflected light from the mold part which is not coated with phosphor. Then, individual light parts to be turned on are alternatively switched to emit light according to a photographic subject or a purpose. Further, a camera captures an image of the LED package via the second filter, thereby making it possible to brightly capture an image of a position of the phosphor.

[Patent Document 1] Japanese Patent Application Laid-Open No. 2014-135482A
[Patent Document 2] Japanese Patent No. 5903563B

SUMMARY OF THE INVENTION

Incidentally, in the first embodiment of Patent Document 1, illumination is made with the blue light but no observation filter is used. In this case, when trying to recognize the LED package emitting strong fluorescence by a monochrome camera, the contrast between a white mold part and the phosphor part is not high. Further, appearance changes depending on the angle of the illumination. Specifically, by setting the illumination closer to the printed circuit board and performing irradiation at a low angle, the contrast between the white mold part and the phosphor part becomes high to some extent, thus enabling recognition of the difference between the white mold part and the phosphor part. However, when setting the illumination distant from the printed circuit board, the contrast between the white mold part and the phosphor part becomes low, resulting in difficulty in recognizing the difference between the white mold part and the phosphor part. Therefore, in the case where the illumination cannot be set closer to the printed circuit board for the reason of a constraint in terms of a mechanical structure or the like, it is difficult to recognize the difference between the white mold part and the phosphor part by the method according to the first embodiment of Patent Document 1.

Note that in the second embodiment of Patent Document 1, the LED package and the printed circuit board are illuminated with the blue light, and an observation filter is used which transmits fluorescent light while cutting blue illumination light. In this case, only the phosphor part is displayed brightly on the image. Accordingly, there is a problem of impossibility of capturing an image of a target which does not emit fluorescence on the printed circuit board.

Further, in the configuration disclosed in Patent Document 2, the LED package and the printed circuit board are irradiated with blue light and a fluorescence observation filter which cuts blue light is used same as in the second embodiment of Patent Document 1. In addition, in Patent Document 2, red illumination is provided, thus constituting a configuration in which images of targets such as the printed circuit board, the LED package and the like can be captured. In this configuration, the structure and control of the illumination are complicated. Further, in Patent Document 2, a dedicated printed circuit board is used to make an illumination part compact, resulting in increase in cost.

The present invention has been made based on the above circumstances and its object is to provide a position recognition apparatus for printed circuit board, a position recognition and processing apparatus, and a printed circuit board manufacturing method, capable of accurately calculating a position of a phosphor of an LED package. Further, it is preferable to provide a position recognition apparatus for printed circuit board, a position recognition and processing apparatus, and printed circuit board manufacturing method, capable of accurately calculating positions of attachment holes for attaching an optical component such as a lens with respect to a phosphor.

To solve the above problem, according to a first viewpoint of the present invention, there is provided a position recognition apparatus for printed circuit board configured to recognize a mounting position of an LED package on the printed circuit board, the LED package including a phosphor emitting fluorescence in operation, the position recognition apparatus for printed circuit board including: an illuminating means configured to irradiate the printed circuit board with light containing a blue component; an observation filter configured to selectively pass at least blue light of reflected light from the printed circuit board and fluorescence from the phosphor and cut light in a wavelength region longer than a wavelength of the blue light; an imaging means configured to capture an image of the light passed by the observation filter; and an image processing means configured to calculate a position of the phosphor on the printed circuit board, based on image data captured by the imaging means.

Further, in another aspect of the present invention, it is preferable in the above invention that: the image processing means includes an angle target calculation unit configured to calculate positions of a plurality of angle targets formed in the printed circuit board to thereby calculate an angle between the plurality of angle targets; and the angle target calculation unit calculates the angle between the plurality of angle targets before or after a time of calculating the position of the phosphor of the LED package on the printed circuit board.

Further, in another aspect of the present invention, it is preferable in the above invention that: the image processing means includes a phosphor region extraction unit configured to extract an image portion of the phosphor region from the image data; and the phosphor extraction unit extracts the image portion of the phosphor by performing binarization processing on a phosphor neighboring and adjacent region being the image data containing the image portion of the phosphor.

Further, in another aspect of the present invention, it is preferable in the above invention that the image processing means includes a barycenter computation unit configured to calculate a barycenter position in an area of the phosphor, based on the image portion of the phosphor extracted by the phosphor region extraction unit.

Further, in another aspect of the present invention, it is preferable in the above invention that the image processing means calculates positions where attachment hole is to be formed in the substrate, based on a calculation result of the position of the phosphor and on a calculation result of the angle between the plurality of angle targets.

Further, in another aspect of the present invention, a position recognition and processing apparatus preferably includes the above-described position recognition apparatus for printed circuit board, an attachment hole for attaching an optical component is formed in the printed circuit board using a printed circuit board processor under a state where the printed circuit board processor is positioned with respect to the LED package, the position being based on a calculation result of the position of the phosphor on the printed circuit board by the image processing means.

Further, according to a second viewpoint of the present invention, there is provided a printed circuit board manufacturing method of recognizing a mounting position of an LED package on the printed circuit board, the LED package including a phosphor emitting fluorescence in operation, and forming an attachment hole in the printed circuit board, the printed circuit board manufacturing method including: an imaging step of irradiating the printed circuit board with light containing a blue component, and capturing an image of the printed circuit board via an observation filter configured to transmit blue light of reflected light from the printed circuit board and fluorescence from the phosphor and not to transmit light in a wavelength region longer than a wavelength of the blue light; a phosphor position calculation step of calculating a position of the phosphor on the printed circuit board, based on image data captured at the imaging step; an angle target position calculation step of calculating positions of a plurality of angle targets on the printed circuit board, the plurality of angle targets being reference positions in forming the attachment holes for attaching an optical component to the printed circuit board with the optical component adjusted in position with respect to the LED package, to thereby calculate an angle between the plurality of angle targets; an attachment hole position calculation step of calculating positions where the attachment holes are to be formed in the printed circuit board, based on the position of the phosphor on the printed circuit board at the phosphor position calculation step and on a calculation result of the angle between the plurality of angle targets on the printed circuit board at the angle target position calculation step; and an attachment hole forming step of forming the attachment holes in the printed circuit board using processing means, based on a calculation result of the positions of the attachment holes in the printed circuit board at the attachment hole position calculation step.

According to the present invention, it is possible to provide a position recognition apparatus for printed circuit board, a position recognition and processing apparatus, and a printed circuit board manufacturing method, capable of accurately calculating a position of a phosphor on an LED package.

DETAILED DESCRIPTION OF THE PREFERRED EMBODIMENT

Figure 1:
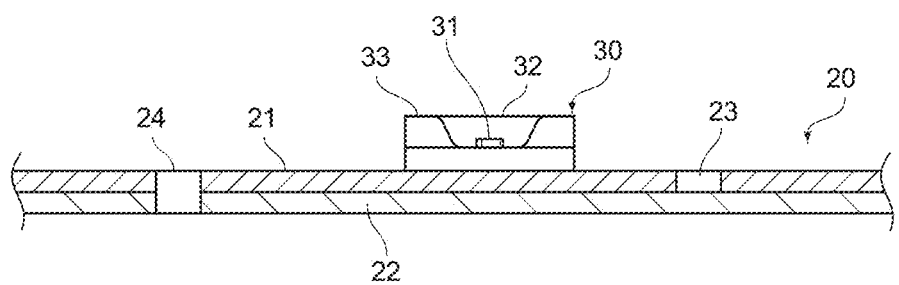
FIG. 1 is a schematic diagram illustrating a printed circuit board on which an LED package being an inspection object is mounted according to one embodiment of the present invention.

Hereinafter, a position recognition apparatus for printed circuit board (printed circuit board position recognition unit 100), a position recognition and processing apparatus 10, and a printed circuit board manufacturing method according to an embodiment of the present invention will be described referring to the drawings. Note that prior to description of the position recognition and processing apparatus 10, a configuration of a flexible printed circuit board 21 being an inspection object will be described, and then the position recognition and processing apparatus 10 and the printed circuit board manufacturing method will be described.

FIG. 1 is a schematic diagram illustrating a printed circuit board on which an LED package being an inspection object is mounted. A printed circuit board 20 is configured such that a heat sink plate 22 made of, for example, aluminum is bonded to the flexible printed circuit board 21. At a predetermined position of the flexible printed circuit board 21, for example, a surface-mount type LED package 30 is mounted. The LED package 30 emits white light, and includes an LED element 31 capable of emitting blue light and a yellow phosphor 32 disposed so as to cover the LED element 31. Therefore, when the LED element 31 emits blue light, the phosphor 32 emits yellow light that is a complementary color of blue. Then, white light can be irradiated by mixing blue light and yellow light.

Around the phosphor 32, a mold part 33 is provided. The mold part 33 is provided in white or a color having a high lightness closer to that of white. Note that in this embodiment, the phosphor 32 and the mold part 33 are each provided so as to be a rectangular shape or an almost rectangular shape (see FIG. 2). However, the phosphor 32 and the mold part 33 are may be provided each in another shape such as a circular shape.

Besides, the flexible printed circuit board 21 is adopted as a printed circuit board 20, but boards other than the flexible printed circuit board 21, such as a rigid board, may be adopted. Besides, a configuration including no heat sink plate 22 made of aluminum may be adopted.

Figure 2:
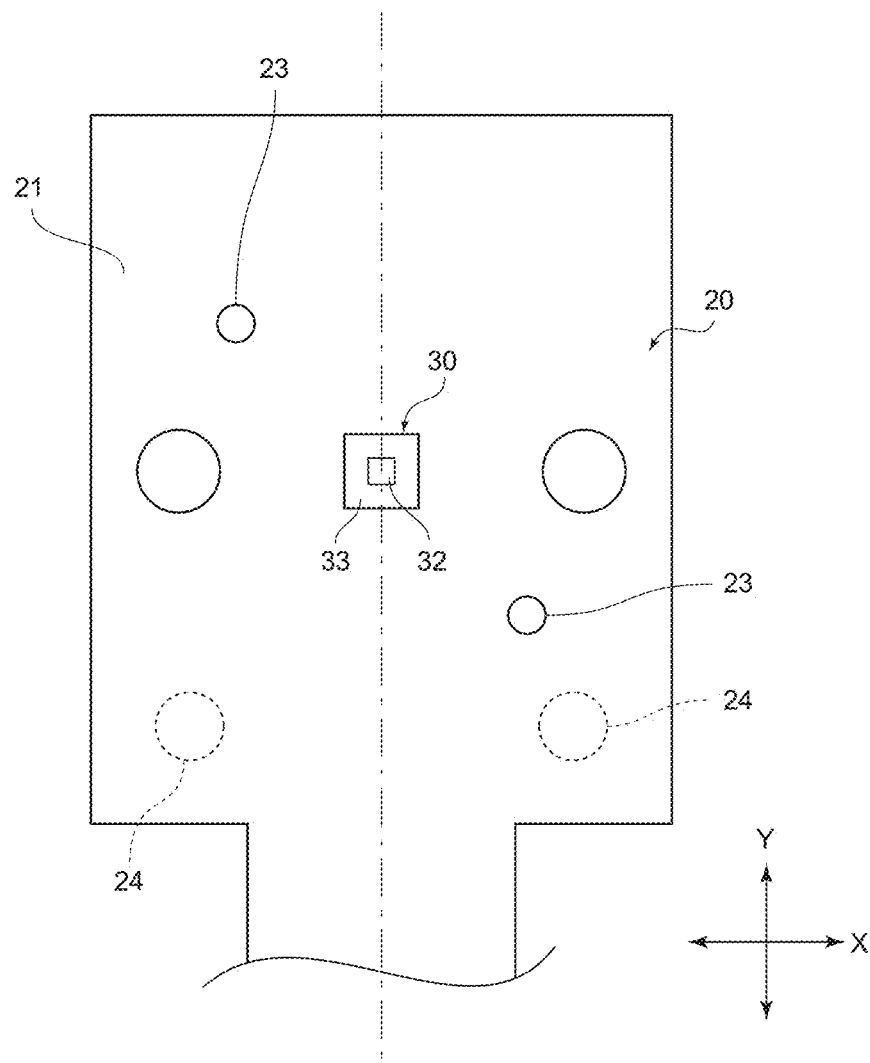
FIG. 2 is a plan view illustrating a configuration of the printed circuit board according to the one embodiment of the present invention.

FIG. 2 is a plan view illustrating a configuration of the printed circuit board 20. Note that attachment holes 24 planned to be formed on the printed circuit board 20 are indicated with broken lines in FIG. 2. As illustrated in FIG. 2, the printed circuit board 20 is formed with angle targets 23. The angle targets 23 are formed at predetermined positions of the flexible printed circuit board 21. In the case of processing the attachment holes 24 for attaching a lens to the printed circuit board 20, the positions of the angle targets 23 and the phosphor 32 of the LED package 30 are recognized and the attachment holes 24 are formed in the printed circuit board 20 on the basis of a result of the recognition.

Here, providing a plurality of, for example, two angle targets 23 makes it possible to calculate an inclination angle of the s printed circuit board 20 on the basis of the respective positions of the angle targets 23. Therefore, the angle targets 23 are used to calculate the inclination angle of the printed circuit board 20. Note that the angle target 23 may be a portion where copper foil of the printed circuit board 20 is removed by etching or the like, an island-shaped portion not remove but left, or a through hole penetrating not only copper foil but also a polyimide base material. Further, the angle target 23 may be formed not in the printed circuit board 20 but in the heat sink plate 22, or may be formed in both the printed circuit board 20 and the heat sink plate 22.

Figure 3:
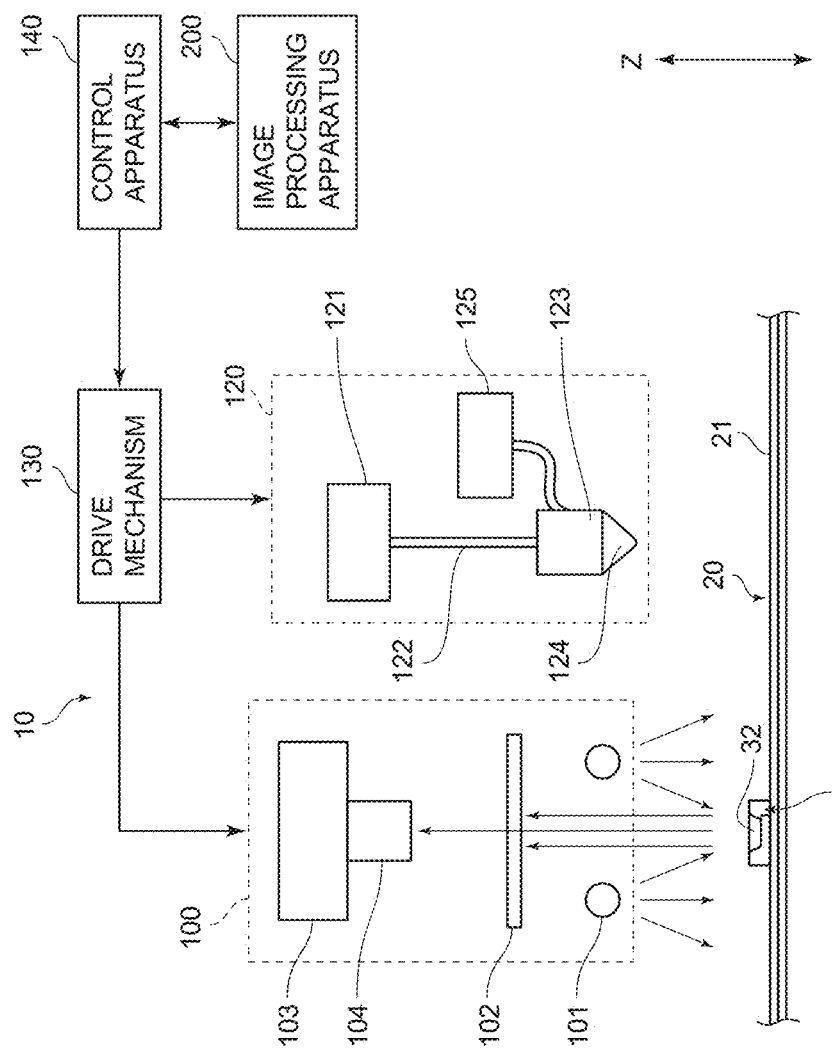
FIG. 3 is a schematic diagram illustrating a configuration of a position recognition and processing apparatus according to the one embodiment of the present invention.

FIG. 3 is a schematic diagram illustrating a configuration of the position recognition and processing apparatus 10 in this embodiment. As illustrated in FIG. 3, the position recognition and processing apparatus 10 includes the printed circuit board position recognition unit 100, a printed circuit board processing unit 120, a drive mechanism 130, a control apparatus 140, an image processing apparatus 200 (corresponding to an image processing means). Note that the printed circuit board position recognition unit 100 corresponds to the printed circuit board position recognition apparatus. Besides, the printed circuit board processing unit 120 corresponds to a printed circuit board processor, and the image processing apparatus 200 corresponds to an image processing means.

The printed circuit board position recognition unit 100 irradiates the installed printed circuit board with blue light and captures an image of reflected light reflected from the printed circuit board using a camera 103. The printed circuit board position recognition unit 100 recognizes the position of the LED package 30 mounted on the printed circuit board on the basis of data of the captured image.

The printed circuit board position recognition unit 100 includes an illuminating lamp 101, an observation filter 102, the camera 103, and a lens barrel 104. Note that the illuminating lamp 101 corresponds to an illuminating means, and the camera 103 corresponds to an imaging means.

The illuminating lamp 101 irradiates the printed circuit board 20, on which the LED package 30 is mounted, with the blue light. The illuminating lamp 101 may be provided, for example, in a ring shape, or may be configured to include a plurality of light sources. Note that in the case where a recognition object is a white LED package 30 composed of the LED element 31 capable of emitting blue light and the phosphor 32, the illuminating lamp 101 has a configuration to perform irradiation with blue light or light containing a blue component (for example, white light). Note that an example of the blue light is light having a wavelength of 435 nm to 480 nm, but the blue light in this embodiment may be in a region slightly different from the wavelength. For example, the blue light in this embodiment may be light having a wavelength in a range of 400 nm to 500 nm.

Note that the wavelength for illumination is preferably in an excitation wavelength band absorbed by the phosphor 32 used in the LED package 30 being the recognition object. This is because when observing in the excitation wavelength band, illumination light is absorbed so that the phosphor 32 is displayed darkly and the white mold part 33 has a constant reflectance regardless of the wavelength of light. In the case where the white LED package 30 is the recognition object, a wavelength of the illumination light of 450 nm to 470 nm which is the wavelength band of the blue LED element 31 employed in a standard white LED package 30 can be used. This is because the phosphor 32 of the LED package 30 is supposed to be selected to absorb the light having the wavelength and emit fluorescence. Besides, since the observation filter 102 cuts fluorescence from the phosphor 32 as will described later, illumination may be white containing an excitation wavelength, or an LED package being the same as the recognition object may be used as the illuminating means. Also in this case, the LED element included in the LED package being the illuminating means is the same as the LED element 31 included in the LED package 30 being the recognition object, so that the phosphor 32 of the LED package 30 being the recognition object absorbs the illumination light and emits fluorescence.

Besides, white illumination such as a halogen lamp or a xenon lamp capable of radiating the above-described white light containing blue light may be used as the illuminating means. In this case, a near-infrared cut filter is disposed on the illuminating lamp 101 (light source) side or the camera 103 side to prevent near-infrared light from being incident on the camera 103.

The observation filter 102 is to cut light other than the excitation wavelength in the wavelength band in which the camera 103 basically has sensitivity. In other words, the observation filter 102 is configured to cut the fluorescence from the phosphor 32. The observation filter 102 may be configured to cut all the light in a wavelength region longer than that of the illumination light but does not have to be able to cut all the light in the long wavelength region as long as it can cut at least light in a fluorescent region.

In the case where the white LED package 30 using the LED element 31 radiating blue light and using the phosphor 32 emitting yellow light is the recognition object, the observation filter 102 may be a B filter (blue filter) transmitting light having a wavelength of 400 nm to 500 nm among commercially available RGB filters. Note that as the RGB filters, a dye-type filter may also be used although a dichroic filter is better in contrast. A dichroic-type B filter has a transmittance of 90%, for example, in the wavelength region of 400 nm to 500 nm. In contrast to this, the dye-type filter has a characteristic curve indicating transmittance in a gently sloped mountain shape having a transmittance peak of about 50% in a graph with the transmittance plotted on a vertical axis and the wavelength plotted on a horizontal axis. Further, the dichroic filter can be adjusted in transmission wavelength region during manufacture of the filter, enabling selection according to properties of the LED element 31 and the phosphor 32 which are the recognition object.

In the case of recognizing a high color-rendering type LED package having an LED element radiating blue light, a green phosphor emitting green light, and a red phosphor emitting red light, the emission spectrum of the green phosphor ranges to a region of a wavelength shorter than 500 nm. Therefore, in the case where the contrast is insufficient when using the B filter (blue filter), use of a filter having a cut end of the wavelength shorter than 500 nm (for example, a filter cutting light shorter than 480 nm) can improve the contrast.

The camera 103 is loaded with an imaging element such as a Charge Coupled Device (CCD) image sensor or a Complementary Metal Oxide Semiconductor (CMOS) image sensor and can acquire image data of the printed circuit board 20 by photographing. Note that the camera 103 may be a color camera although a monochrome camera is higher in resolution.

The lens barrel 104 is attached to the side, on which light is incident, of the camera 103. Inside the lens barrel 104, for example, an optical system such as a telecentric lens is accommodated, and radiates an optical image (radiation light) passed through the lens barrel 104 to the camera 103.

Next, the printed circuit board processing unit 120 will be described. The printed circuit board processing unit 120 includes a laser oscillator 121, an optical path 122, a light collecting system 123, a nozzle 124, and an assist gas supply source 125.

Next, the printed circuit board processing unit 120 will be described. The printed circuit board processing unit 120 includes a laser oscillator 121, an optical path 122, a light collecting system 123, a nozzle 124, and an assist gas supply source 125.

The laser oscillator 121 is a portion that oscillates laser light of a predetermined wavelength. The optical path 122 is a portion that guides, like a mirror, an optical fiber or the like, the laser light radiated from the laser oscillator 121 to the light collecting system 123. The light collecting system 123 is a portion that collects the laser light radiated from the optical path 122 to an appropriate beam diameter. The nozzle 124 is a portion that radiates the laser light collected by the light collecting system 123. Note that the laser light radiated from the nozzle 124 is radiated to a portion where the above-described attachment hole 24 of the s printed circuit board 20 is to be formed, to thereby form the hole 24 in the printed circuit board 20.

Further, the printed circuit board position recognition unit 100 and the printed circuit board processing unit 120 are movable by the drive mechanism 130. The drive mechanism 130 is a portion that includes a not-illustrated motor, and is driven by the motor to enable movement of the printed circuit board position recognition unit 100 and the printed circuit board processing unit 120 in plane directions parallel to the printed circuit board 20 (an X-direction and a Y-direction; see FIG. 2). Further, the drive mechanism 130 may enable movement in a height direction being a direction of moving up and down with respect to the printed circuit board 20. Note that the drive mechanism 130 may be configured not to enable movement of the printed circuit board position recognition unit 100 and the printed circuit board processing unit 120 but to enable movement of the printed circuit board 20 side.

Besides, the control apparatus 140 is a portion that controls the driving of the drive mechanism 130. The control apparatus 140 is connected to the image processing apparatus 200, and manages the driving of the drive mechanism 130 on the basis of the image processing result in the image processing apparatus 200. Note that the image processing apparatus 200 is, for example, a computer, and executes a predetermined image processing program stored in a memory including an external memory device to enable execution of the predetermined image processing on image data transmitted from the camera 103.

Figure 4:
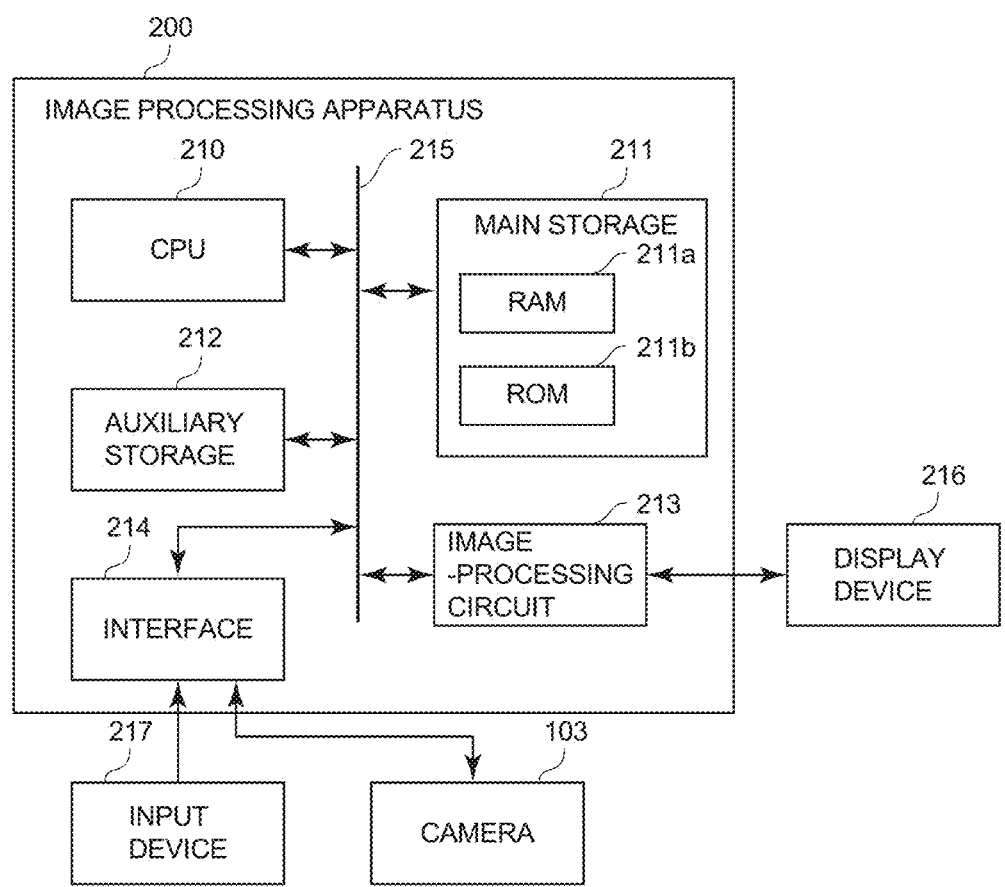
FIG. 4 is a block diagram illustrating a configuration of an image processing apparatus according to the one embodiment of the present invention.

Note that, as illustrated in FIG. 4, the image processing apparatus 200 includes, as main components, a Central Processing Unit (CPU) 210, a main storage 211, an auxiliary storage 212, an image processing circuit 213, an interface 214, a bus 215, a display device 216, and an input device 217. The CPU 210 is a portion that executes various kinds of arithmetic operation processing according to the programs stored in the main storage 211 and the auxiliary storage 212 and controls the operations of the printed circuit board position recognition unit 100, the printed circuit board processing unit 120, the drive mechanism 130 and other devices.

The main storage 211 is a storage that the CPU 210 can directly access, and includes, for example, a ROM 211*a* and a RAM 211*b*. The ROM 211*a* is a memory that stores basic programs executed by the CPU 210 and data. The RAM 211*b* is a memory that temporarily stores the program that the CPU 210 is executing, data under operation and the like.

The auxiliary storage 212 is a recording device that includes a recording medium such as a hard disk or a flash memory, reads out data and programs recorded on the recording medium in response to a request from the CPU 210, and records data generated as a result of the operation processing by the CPU 210 on the recording medium.

The image processing circuit 213 includes a video memory and the like, and executes drawing processing based on a draw command supplied from the CPU 210, converts obtained image data into a video signal, and supplies the video signal to the display device 216. Note that in the case of using, for example, a Graphical Processing Unit (GPU) as the image processing circuit 213, a parallel operation speed is higher than that by the CPU 210, but the GPU may be omitted and the CPU 210 may be made to perform the operation, The interface 214 is a portion that converts an expression form of information supplied from devices such as the input device 217 and the camera 103 into an internal form and reads in the information. As the interface 214, those of various standards including a Universal Serial Bus (USB) can be used. The bus 215 is a signal line that mutually connects the CPU 210, the main storage 211, the auxiliary storage 212, the image processing circuit 213, and the interface 214 to enable communication of data among them.

The display device 216 is a device that displays an image according to the video signal inputted from the image processing circuit 213 like, for example, an Liquid Crystal Display (LCD) monitor, a Cathode Ray Tube (CRT) monitor or the like. Besides, the input device 217 is an input device such as a key board, a mouse or the like, and generates information according to an operation by a user and outputs the information.

<Regarding a Functional Block and a Processing Flow>

Figure 5:
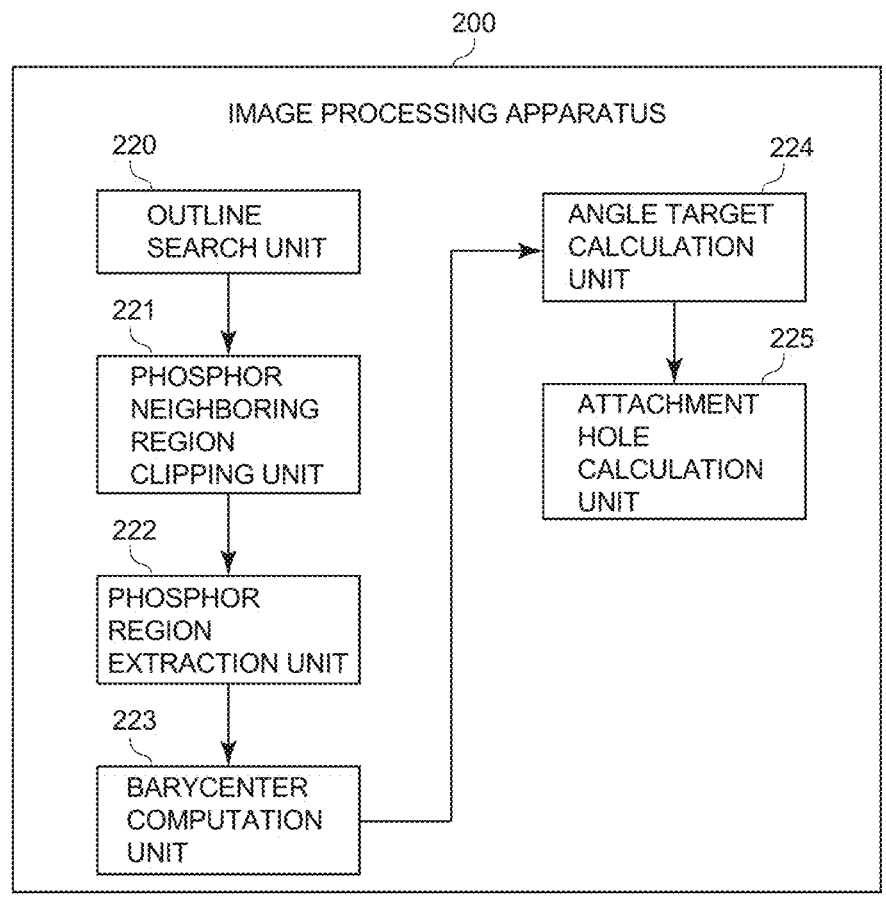
FIG. 5 is a diagram illustrating a functional block at the time when performing image processing on image data in the case where the image data transmitted from a camera is inputted into the image processing apparatus, according to the one embodiment of the present invention.

A configuration illustrated in a block diagram in FIG. 5 is functionally realized by cooperation of hardware such as the CPU 210 and so on as above with software and/or data stored in the main storage 211 and the auxiliary storage 212, or addition or the like of circuits and components performing special processing. FIG. 5 is a diagram illustrating a functional block at the time when performing image processing on the image data in the case where the image data transmitted from the camera 103 is inputted into the image processing apparatus 200.

Figure 6:
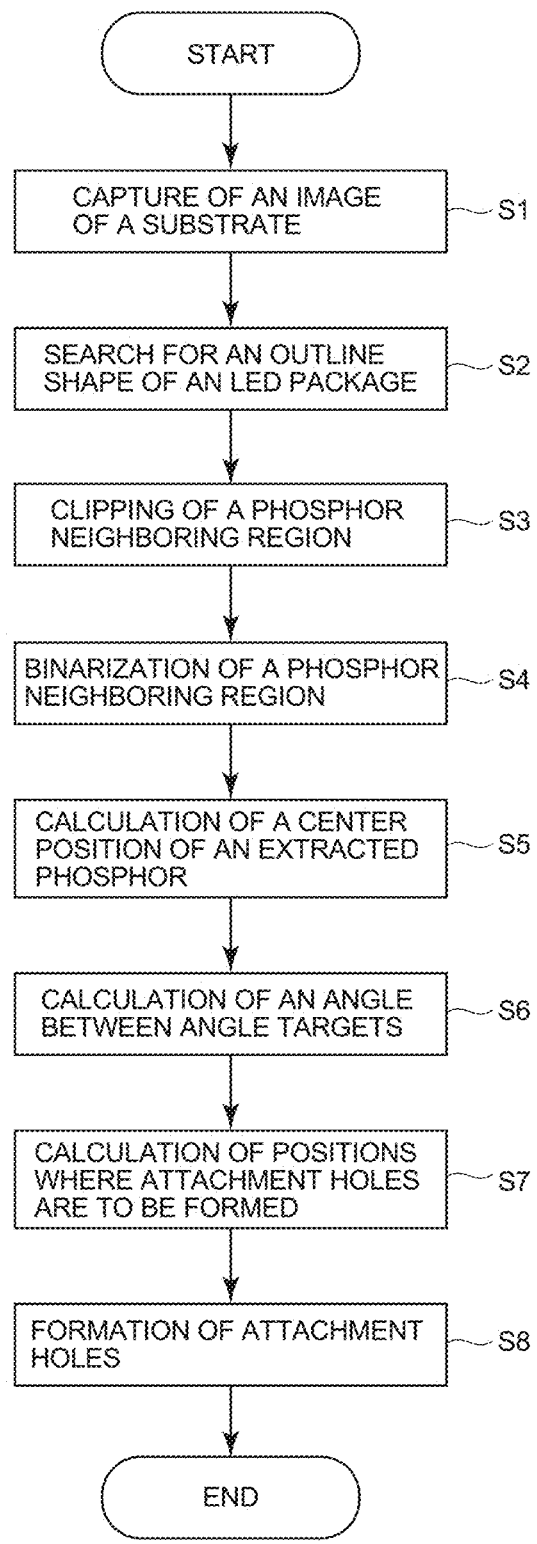
FIG. 6 is a chart illustrating a processing flow at the time when forming attachment holes in the printed circuit board, according to the one embodiment of the present invention.

As illustrated in FIG. 5, the image processing apparatus 200 includes an outline search unit 220, a phosphor neighboring region clipping unit 221, a phosphor region extraction unit 222, a barycenter computation unit 223, an angle target calculation unit 224, and an attachment hole calculation unit 225. Note that the configurations of them will be described in and together with the description for steps of a processing flow in FIG. 6.

(Step S1: Capture of an Image of a Substrate)

Figure 7:
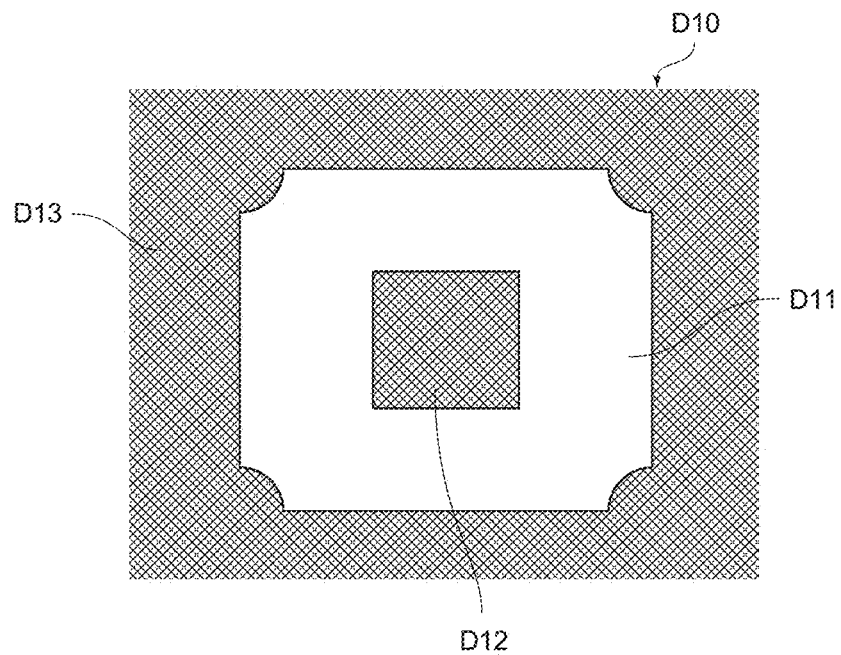
FIG. 7 is a view illustrating image data captured by the camera, according to the one embodiment of the present invention.

Upon arrival of predetermined image capture timing or by an instruction or the like from an operator, the control apparatus 140 actuates the illuminating lamp 101 and actuates the camera 103 to capture an image of the printed circuit board 20 including the LED package 30. In this event, the illuminating lamp 101 radiates blue light or light containing a blue component (white light or the like) toward the printed circuit board 20 and the LED package 30. Then, image data 10 as illustrated in FIG. 7 is acquired, and the camera 103 transmits the image data to the image processing apparatus 200. Note that Step S1 corresponds to an imaging step.

Here, in this embodiment, the image of the printed circuit board 20, which is captured by the camera 103, is captured via a blue observation filter 102. Accordingly, in the image capturing, the blue light component, which is in a short wavelength of the light reflected from the mold part 33, passes through the blue observation filter 102, however, yellow fluorescence radiated from the yellow phosphor 32 is reflected or absorbed by the blue observation filter 102 and therefore can scarcely pass through the blue observation filter 102. Therefore, when the image is captured by the camera 103 via the blue observation filter 102, the white mold part 33 is displayed brightly and the phosphor 32 is displayed darkly.

Note that, in the following description, a portion obtained by capturing an image of the white mold part 33 is called a mold part image captured portion D11. Besides, a portion obtained by capturing an image of the phosphor 32 is called a phosphor image captured portion D12. Besides, a dark region obtained by capturing an image of the printed circuit board 20, existing around the mold part image captured portion D11, is called a printed circuit board image captured portion D13.

(Step S2: Search for an Outline Shape of an LED Package)

Next, the image processing apparatus 200 searches for an outline shape of the LED package 30 from the image data D10. The outline search unit 220 illustrated in FIG. 5 is a portion that searches for the outline shape of the LED package 30 from the image data D10 transmitted from the camera 103. As illustrated in FIG. 7, in the captured image data D10, there is a high contrast between the mold part image captured portion D11 obtained by capturing the image of the white mold part 33 and the printed circuit board image captured portion D13 therearound.

In other words, when the camera 103 receives light via the above-described blue observation filter 102, the mold part image captured portion D11 has a large gradation value, and the printed circuit board image captured portion D13 therearound has a small gradation value. Accordingly, based on the contrast, it is possible to recognize the position of the outline (contour) of the LED package 30. In this case, the edge of the outline can be recognized depending on, for example, whether or not the graduation value exceeds a predetermined threshold value corresponding to the brightness between the bright portion (mold part image captured portion D11) and the dark portion (printed circuit board image captured portion D13 therearound).

Here, the search for the outline shape by the outline search unit 220 is a process that is a clue for searching for the phosphor 32, and therefore the search accuracy does not have to be so high. Besides, the outline (contour) of the LED package 30 may be the outline (contour) of an actual LED package 30, or not the outline (contour) of an actual LED package 30 but the outline (contour) of the mold part 33 may be used as a substitute for the outline. Note that Step S2 to Step S5 correspond to a phosphor position calculation step.

(Step S3: Clipping of a Phosphor Neighboring Region)

Figure 8:
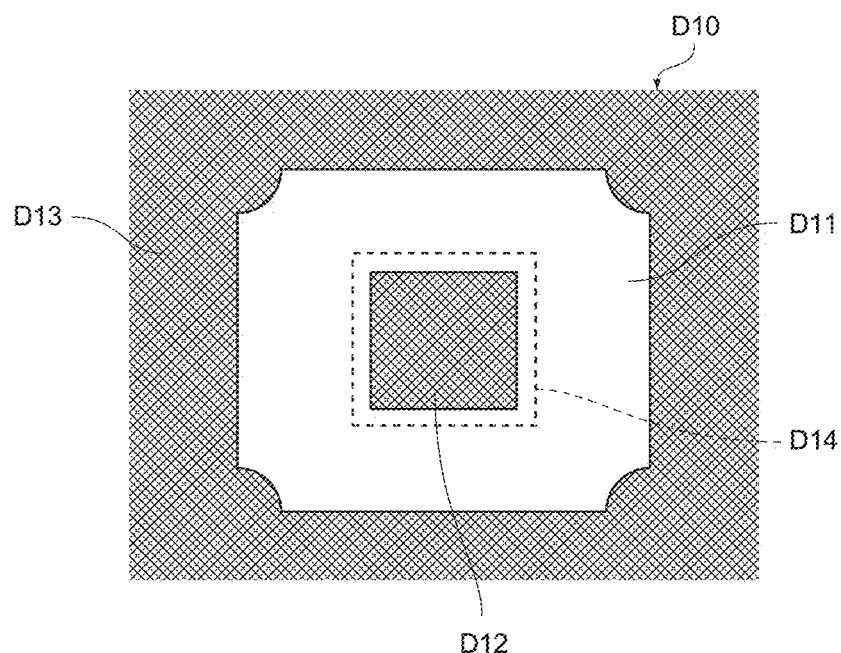
FIG. 8 is a view illustrating an image of a phosphor neighboring and adjacent region clipped out by a phosphor neighboring region clipping unit in the image data, according to the one embodiment of the present invention.

Next, based on the outline shape searched at Step S2, the phosphor neighboring region clipping unit 221 clips out a phosphor neighboring and adjacent region D14 including the phosphor 32. FIG. 8 is a view illustrating an image of the phosphor neighboring and adjacent region D14 in the image data D10, clipped out by the phosphor neighboring region clipping unit 221, in which a portion surrounded by a broken line is clipped out.

The phosphor neighboring and adjacent region D14 includes the phosphor image captured portion D12 and the mold part image captured portion D11 therearound. As is clear from FIG. 8, the contrast between the phosphor image captured site D12 and the mold part image captured site D11 is high. Accordingly, it is possible to recognize the position of the outline (contour) of the phosphor 32, based on the contrast.

(Step S4: Binarization of a Phosphor Neighboring Region)

Figure 9:
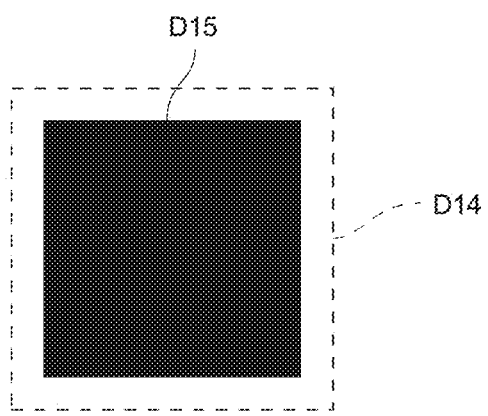
FIG. 9 is a view illustrating an image after binarization processing is performed on the phosphor neighboring and adjacent region illustrated in FIG. 8.

Next, the phosphor region extraction unit 222 performs binarization processing on the phosphor neighboring and adjacent region D14 clipped out at Step S3. FIG. 9 is a view illustrating an image after the binarization processing is performed. The phosphor neighboring and adjacent region D14 clipped out at Step S3 includes the phosphor image captured portion D12 and the mold part image captured portion D11 therearound as illustrated in FIG. 8 and the contrast between them is high. Accordingly, performing the binarization processing to create two gradations of, for example, white and black by a predetermined threshold value makes the portion corresponding to the phosphor image captured portion D12, which is the image captured portion of the phosphor 32, black to enable determination of a region where the phosphor 32 exists. In the following description, the black portion where the phosphor 32 exists as a result of performing the binarization processing is called a phosphor binarized region D15.

Here, in the case of binarizing the phosphor image captured portion D12, white portions are present in some places in the black portion in the phosphor binarized region D15 depending on the processing result. However, such portions are supposed to be portions where the phosphor 32 essentially exists. Accordingly, filling-in the white portions in the phosphor binarized region D15 with black is performed in the binarization processing and then later-described barycenter computation at Step S5 may be performed, or the barycenter computation at Step S5 may be performed in a state where the white portions are left.

Note that in the above-described binarization processing, when determine a boundary line of the phosphor 32, an intermediate of a gradient between a pixel value indicated by the mold part 33 and a pixel value indicated by the black phosphor 32 may be the threshold value.

(Step S5: Calculation of a Center Position of an Extracted Phosphor Region)

Next, the barycenter computation unit 223 calculates the center position of the phosphor 32 by calculating the barycenter position of the area of the phosphor 32 extracted by the binarization processing at Step S4. In this case, for example, positional information (X-coordinates and Y-coordinates) of black pixels in the region of the phosphor binarized region D15 is integrated, and an average value of the X-coordinates and an average value of the Y-coordinates obtained by dividing the integrated positional information by the number of pixels are regarded as the barycenter position. In this event, the barycenter position can be calculated with all pixels within a range surrounded by the contour of the phosphor binarized region D15 being regarded as black pixels. Alternatively, it is also adoptable that all pixels within the range surrounded by the contour of the phosphor binarized region D15 are regarded as black pixels, the X-coordinates and the Y-coordinates of corner points of the phosphor 32 (four corner points, for example, in the case where the phosphor binarized region D15 (phosphor 32) is a rectangle) are found, and the average values of the X-coordinates and the Y-coordinates of the corner points are used as the barycenter position.

Besides, when the phosphor binarized region D15 (phosphor 32) is a rectangle, computation of the center position may be performed by finding respective center points at four sides constituting the contour of the phosphor binarized region D15. However, the barycenter position, when computed and regarded as the center position, can be computed by the same method even if the shape of the phosphor 32 is a rectangle or an arbitrary shape other than the rectangle such as a circle, an ellipse or the like.

(Step S6: Calculation of an Angle Between Angle Targets)

Next, the angle target calculation unit 224 performs processing of calculating the angle between the angle targets 23 on the basis of the image data D10 transmitted from the camera 103. The angle targets 23 exist at positions separated by a predetermined distance from the LED package 30 on the printed circuit board 20. Accordingly, in the case where the angle target calculation unit 224 calculates the positions of the angle targets 23 on the printed circuit board 20, rough positions of the angle targets 23 are calculated from the barycenter position of the phosphor binarized region D15 (phosphor 32) calculated in the above, and the angle between the two angle targets 23 can be calculated based on the positions of the angle targets 23.

In this event, the rough positions of the angle targets 23 may be calculated from the inclination or the position of the boundary between the phosphor image captured portion D12 (phosphor 32) and the mold part image captured portion D11 (mold part 33). Through the calculation, a part of the image data D10 is clipped out from the region on the printed circuit board 20, the region being predicted that the angle targets 23 exist thereon as described above. The angle target calculation unit 224 then performs processing similar to the binarization processing at Step S4 to calculate a barycenter position similar to that at Step S5. Thus, the angle target calculation unit 224 can calculate the positions of the two angle targets 23 on the substrate 20, and calculate the angle between the angle targets 23.

Note that the processing of recognizing the angle targets 23 at Step S6 may be performed prior to the calculation of the barycenter position of the phosphor 32 with respect to the LED package 30. In this case, the rough position of the LED package 30 on the substrate 20 can be calculated starting from the positions of the angle targets 23 on the printed circuit board 20. Note that Step S6 corresponds to an angle target position calculation step.

(Step S7: Calculation of Positions where Attachment Holes are to be Formed)

Next, the attachment hole calculation unit 225 calculates the positions where the attachment holes 24 are to be formed in the substrate 20, based on the barycenter position of the phosphor 32 calculated at Step S5 and on the angle between the angle targets 23 calculated at Step S6. As illustrated in FIG. 2, for example, two angle targets 23 are formed in the printed circuit board 20, and the position, the inclination and the like of the printed circuit board 20 can be calculated from the angle targets 23. Accordingly, if the position of the phosphor 32 with respect to the two angle targets 23 can be found, the positions where the attachment holes 24 are to be formed in the printed circuit board 20 can be calculated. Accordingly, the attachment hole calculation unit 225 calculates the positions where the attachment holes 24 are to be formed in the printed circuit board 20, based on the positons of the angle targets 23 and the phosphor 32. Note that Step S7 corresponds to an attachment hole position calculation step.

(Step S8: Forming of Attachment Holes)

Next, the printed circuit board processing unit 120 is actuated on the position where the attachment hole 24 is to be formed in the printed circuit board 20 calculated at Step S7, to form the attachment hole 24. In this event, the control apparatus 140 actuates the drive mechanism 130 to align the nozzle 124 with the printed circuit board 20, while actuating the laser oscillator 121 to radiate laser light from the nozzle 124. Further, while the laser light is radiated from the nozzle 124, the drive mechanism 130 moves the printed circuit board processing unit 120. This movement is performed so that a portion irradiated with the laser light has the contour of the attachment hole 24. Thus, the attachment hole 24 is formed in the printed circuit board 20. At this time, the attachment hole 24 is formed based on the position of the phosphor 32, so that the positional accuracy between the phosphor 32 and the attachment hole 24 is high. Accordingly, when a lens is attached to the printed circuit board 20 based on the position of the attachment holes 24, the positional accuracy between the phosphor 32 and the attachment holes 24 is high, thus making it possible to prevent displacement of an optical axis of the lens with respect to the phosphor 32. Note that Step S8 corresponds to an attachment hole forming step.

Note that after Step S8, an optical component is attached to the substrate 20 based on the attachment holes 24. Thus, the optical axes of the optical component and the LED package 30 are brought into a state of being accurately aligned.

3. Regarding Effects

According to the printed circuit board position recognition apparatus (printed circuit board position recognition unit 100), the position recognition and processing apparatus 10, and the printed circuit board manufacturing method having the above configuration, in the printed circuit board position recognition apparatus (printed circuit board position recognition unit 100) configured to recognize the mounting position on the printed circuit board 20 of the LED package 30 including the phosphor 32 emitting fluorescence in operation, the illuminating lamp 101 (illuminating means) irradiates the printed circuit board 20 with the light containing the blue component. Besides, the observation filter 102 transmits reflected light in an excitation wavelength region from the printed circuit board 20 and does not transmit fluorescence of a wavelength longer than the excitation wavelength region. In the case where the illuminating lamp 101 is white, reflected light of a wavelength longer than that of blue light also exists but is cut together with fluorescence by the observation filter 102. Further, the camera 103 (imaging means) captures an image of light transmitted through the observation filter 102, and the image processing apparatus 200 (image processing means) calculates the position of the phosphor 32 on the printed circuit board 20, based on the image data D10 captured by the camera 103 (imaging means).

Accordingly, the observation filter 102 transmits blue light. On the other hand, the phosphor 32 absorbs blue light being excitation light and emits yellow fluorescence of a long wavelength, and is thus low in reflectance for blue light. However, the white mold part 33 reflects blue light as it is, and is thus high in reflectance for blue light. Therefore, when an image is captured through the blue observation filter 102, the contrast (difference in graduation value) between the mold part image captured portion D11 and the phosphor image captured portion D12 is high in the image data D10 captured by the camera 103 as illustrated in FIG. 7. Accordingly, the position of the phosphor image captured portion D12 in the image data D10 can be easily calculated, thereby making it possible to calculate the position of the phosphor 32 on the printed circuit board 20.

Figure 10:
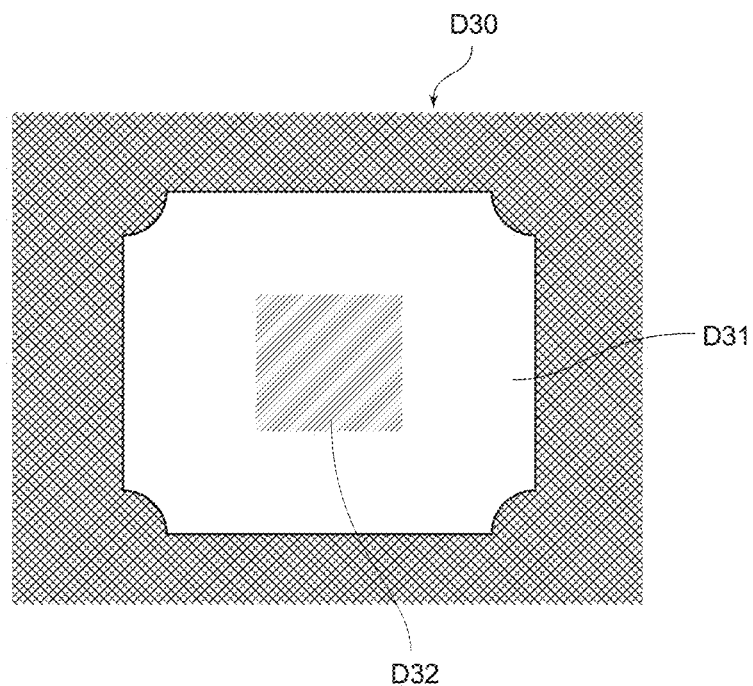
FIG. 10 is a view illustrating a state where a contrast between a mold part image captured portion corresponding to a mold part and a phosphor image captured portion corresponding to a phosphor is low, according to a comparative example.

Besides, on execution in the configuration of a first embodiment of Patent Document 1, the contrast between a mold part image captured portion D31 corresponding to the mold part 33 and a phosphor image captured portion D32 corresponding to the phosphor 32 was low in image data D30 obtained by capturing images of the phosphor 32 and the mold part 33 as illustrated in FIG. 10. The configuration of the first embodiment of Patent Document 1 does not have a component corresponding to the observation filter 102 that transmits blue light but cuts yellow light. The phosphor 32 converts incident blue light to yellow light, whereas a monochrome camera has sensitivity both for blue light and yellow light. Therefore, the contrast between the blue light reflected by the mold part 33 and the yellow fluorescence radiated from the phosphor 32 is low.

Contrarily, in this embodiment, different from the configuration disclosed in the first embodiment of Patent Document 1, the printed circuit board position recognition apparatus (printed circuit board position recognition unit 100) has the observation filter 102. Accordingly, the observation filter 102 does not transmit but cuts the yellow fluorescence radiated from the phosphor 32, and thus can darkly capture an image of the phosphor 32. Accordingly, the contrast (difference in graduation value) between the mold part image captured portion D11 and the phosphor image captured portion D12 is high, so that the position of the phosphor image captured portion D12 in the image data D10 can be easily calculated, thereby making it possible to calculate the position of the phosphor 32 on the printed circuit board 20.

Figure 11:
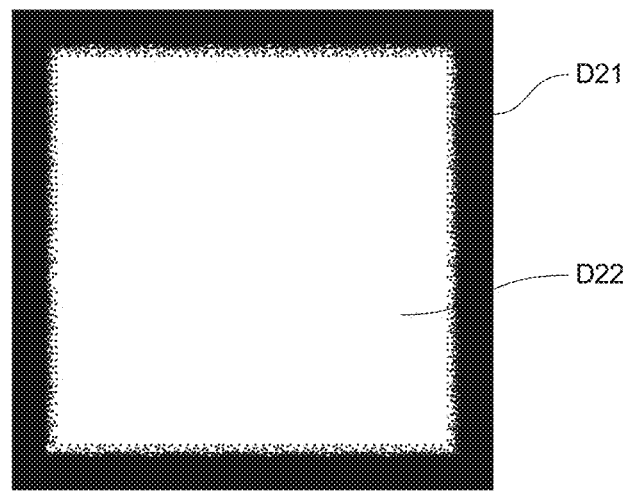
FIG. 11 is a view illustrating a result of capturing an image of the surroundings of the phosphor in the case where an image of the phosphor is captured brightly and an image of the mold part is captured darkly, according to a comparative example.

FIG. 11 is a view illustrating a result of capturing an image of the surroundings of the phosphor 32 in the case where an image of the phosphor 32 is captured brightly and an image of the mold part 33 is captured darkly as in Patent Document 2. FIG. 11 is a view illustrating an appearance of a case where an image of the phosphor 32 is captured to be brighter than the mold part 33. In image data D20 illustrated in FIG. 11, when an image of the phosphor 32 is captured, a phosphor image captured portion D22 corresponding to the phosphor 32 whose image is captured brightly influences a mold part image captured portion D21 corresponding to the mold part 33 whose image is captured darkly existing therearound, resulting in an unclear contour of the phosphor 32 (phosphor image captured portion D22). This is because the fluorescence from the phosphor 32 is reflected and scattered as it is by the white mold part 33. Accordingly, the positional accuracy of the barycenter position of the phosphor image captured portion D22 obtained by capturing an image of the phosphor 32 is deteriorated, for example, depending on the setting status or the like of the threshold value of the gradation value.

Contrarily, in this embodiment, the excitation wavelength of the phosphor 32 is used for the wavelength of illumination by the illuminating lamp 101, so that the reflected light scattered in the white mold part 33 is absorbed by the phosphor 32 and converted to fluorescence. Since the fluorescence is cut by the observation filter 102, the scattered light from the white mold part 33 less influences the phosphor image captured portion D12 on the image data D20, thus making it possible to capture an image in a state where the contour of the phosphor 32 is clear. This enables accurate calculation of the barycenter position of the phosphor image captured portion D12 obtained by capturing an image of the phosphor 32.

Further, in this embodiment, the image processing apparatus 200 (image processing means) includes the angle target calculation unit 224 configured to calculate positions of a plurality of angle targets 23 formed on the printed circuit board 20 to thereby calculate the angle between the plurality of angle targets 23. The angle target calculation unit 224 calculates the angle between the plurality of angle targets 23 before or after the time of calculating the position on the printed circuit board 20 of the phosphor 32.

Therefore, the positions where the attachment holes 24 are to be formed can be accurately set with respect to the optical component such as a lens on the printed circuit board 20. Accordingly, it is possible to prevent the position of phosphor 32 from being displaced with respect to the optical axis of the optical component at the time when attaching the optical component such as a lens based on the attachment holes 24 on the printed circuit board 20, Further, in this embodiment, the image processing apparatus 200 (image processing means) includes the phosphor region extraction unit 222 configured to extract an image portion of the phosphor 32 from the image data D10. The phosphor region extraction unit 222 extracts the image portion (phosphor image captured portion D12) of the phosphor 32 by performing binarization processing on the phosphor neighboring and adjacent region D14 being the image data containing the image portion of the phosphor image captured portion D12. This makes it possible to easily extract a portion corresponding to the phosphor 32 from the image data D10.

Further, in this embodiment, the image processing apparatus 200 (image processing means) includes the barycenter computation unit 232 configured to calculate the barycenter position in the area of the phosphor 32, based on the image portion (phosphor image captured portion D12) of the phosphor 32 extracted by the phosphor region extraction unit 222. Accordingly, it is possible to accurately calculate the positions where the attachment holes 24 are to be formed, with respect to the center of the LED package 30 (phosphor 32), based on the computation result by the barycenter computation unit 223.

Further, in this embodiment, the image processing apparatus 200 (image processing means) calculates the positions where the attachment holes 24 are to be formed in the printed circuit board 20, based on the calculation result of the position of the phosphor 32 and on the calculation result of the angle between the plurality of angle targets 23. Accordingly, it is possible to accurately calculate the positions where the attachment holes 24 are to be formed in the printed circuit board 20.

Further, the position recognition and processing apparatus 10 in this embodiment forms the attachment holes 24 for attaching the optical component to the printed circuit board 20 with the optical component adjusted in position with respect to the LED package 30, based on the calculation result of the position of the phosphor 32 on the printed circuit board 20 by the image processing apparatus 200 (image processing means). Therefore, the attachment holes 24 for attaching the optical component such as a lens can be formed in the printed circuit board 20 with high accuracy with respect to the phosphor 32.

4. Modified Examples

One embodiment of the present invention has been described above, and the present invention is modified into various forms other than that. Hereinafter, they will be described.

In the above embodiment, the printed circuit board processing unit 120 is used to radiate the laser light from the nozzle 124 to form the attachment hole 24. However, the forming means of the attachment hole 24 in the printed circuit board 20 is not limited to the laser light. For example, a working machine with a tool such as a drill may be used to from the attachment hole 24.

Besides, in FIG. 1, the angle target 23 is a portion obtained by stamping out from the printed circuit board 20. However, the angle target 23 may be a portion obtained by not stamping out from the printed circuit board 20 but marking in a predetermined color at the angle target 23. Alternatively, for example, a punch hole in a recessed shape non-penetrating the printed circuit board 20 may be formed, and the punch hole may be used as the angle target 23.

Besides, in the above embodiment, the printed circuit board 20 is the one in which the heat sink plate 22 made of aluminum is bonded to the flexible printed circuit board 21. However, the printed circuit board 20 may be another printed circuit board. Examples of the other printed circuit board include the ones made by bonding a separate film to or providing a plating portion on a flexible printed circuit board.

Besides, a lens is exemplified as the optical component in the above embodiment, but the optical component is not limited to the lens. Examples of the optical component include a reflector, a polarizing plate, a wavelength plate, a prism and so on including a mirror.

Besides, the observation filter 102 is arranged between the illuminating lamp 101 and the lens barrel 104 in the above embodiment. However, the observation filter 102 may be arranged between the illuminating lamp 101 and the printed circuit board 20. Alternatively, the physical observation filter 102 may not be used but an image processing filter may be used to obtain the same effect.

Besides, in the above embodiment, in the case where the camera 103 is a color camera in which the imaging element includes a sensor element capable of recognizing blue light, a sensor element capable of recognizing red light, and a sensor element capable of recognizing green light, later-described image data D10 may be obtained based on a light reception result only by the sensor element capable of recognizing blue light. In this case, though the resolution is deteriorated as compared with the monochrome camera, the same effect as that in the case of using the observation filter 102 can be obtained.

Besides, in the above embodiment, the position recognition and processing apparatus 10 includes the printed circuit board position recognition unit 100 and the printed circuit board processing unit 120, and further includes the control apparatus 140 and the image processing apparatus 200. However, they may be configured to be incorporated in one apparatus, or may be separately provided and configured to be connected over a network or the like. Note that such a configuration may be employed that a plurality of position recognition and processing apparatuses 10 are connected to one image processing apparatus 200 over a network. In this case, the image processing apparatus 200 may perform image processing on the image data transmitted from the camera 103 of each of the position recognition and processing apparatuses 10, and transmit information of the positions, which is the image processing result, where the attachment holes 24 are to be formed to the control apparatus 140.

DESCRIPTION OF REFERENCE NUMERALS

10 . . . position recognition and processing apparatus, 20 . . . printed circuit board, 21 . . . flexible printed circuit board, 22 . . . heat sink plate, 23 . . . angle target, 24 . . . attachment hole, 30 . . . LED package, 31 . . . LED element, 32 . . . phosphor, 33 . . . mold part, 100 . . . printed circuit board position recognition unit (corresponding to printed circuit board position recognition apparatus), 101 . . . illuminating lamp (corresponding to illuminating means), 102 . . . observation filter, 103 . . . camera (corresponding to imaging means), 104 . . . lens barrel, 120 . . . printed circuit board processing unit (corresponding to printed circuit board processor), 121 . . . laser oscillator, 122 . . . optical path, 123 . . . light collecting system, 124 . . . nozzle, 125 . . . assist gas supply source, 200 . . . image processing apparatus (corresponding to image processing means), 210 . . . CPU, 211 . . . main storage, 212 . . . auxiliary storage, 213 . . . image processing circuit, 214 . . . interface, 215 . . . bus, 216 . . . display device, 217 . . . input device, 220 . . . outline search unit, 221 . . . phosphor neighboring region clipping unit, 222 . . . phosphor region extraction unit, 223 . . . barycenter computation unit, 224 . . . angle target calculation unit, 225 . . . attachment hole calculation unit, D10, D20, D30 . . . image data, D11, D21, D31 . . . mold part image captured portion, D12, D22, D32 . . . phosphor image captured portion, D13 . . . printed circuit board image captured portion, D14 . . . phosphor neighboring and adjacent region, D15 . . . phosphor binarized region

What is claimed is:

1. A position recognition apparatus for printed circuit board configured to recognize a mounting position of an LED package on the printed circuit board, the LED package including a phosphor emitting fluorescence in operation, the position recognition apparatus for printed circuit board comprising:
an illuminating means configured to irradiate the printed circuit board with light containing a blue component;
an observation filter configured to selectively pass at least blue light of reflected light from the printed circuit board and fluorescence from the phosphor and cut light in a wavelength region longer than a wavelength of the blue light;
an imaging means configured to capture an image of the light passed by the observation filter; and
an image processing means configured to calculate a position of the phosphor on the printed circuit board, based on image data captured by the imaging means.

2. The position recognition apparatus for printed circuit board according to claim 1, wherein:
the image processing means includes an angle target calculation unit configured to calculate positions of a plurality of angle targets formed in the printed circuit board to thereby calculate an angle between the plurality of angle targets; and
the angle target calculation unit calculates the angle between the plurality of angle targets before or after a time of calculating the position of the phosphor of the LED package on the printed circuit board.

3. The position recognition apparatus for printed circuit board according to claim 2, wherein:
the image processisng means includes a phosphor region extraction unit configured to extract an image portion of the phosphor from the image data; and
the phosphor region extraction unit extracts the image portion of the phosphor by performing binarization processing on a phosphor neighboring and adjacent region being the image data containing the image portion of the phosphor.

4. The position recognition apparatus for printed circuit board according to claim 3, wherein
the image processing means includs a barycenter computation unit configured to calculate a barycenter position in an area of the phosphor, based on the image portion of the phosphor extracted by the phosphor region extraction unit.

5. The position recognition apparatus for printed circuit board according to claim 4, wherein
the image processing means calculates positions where a attachment hole is to be formed in the substrate, based on a calculation result of the position of the phosphor and on a calculation result of the angle between the plurality of angle targets.

6. A position recognition and processing apparatus including the position recognition apparatus for printed circuit board according to claim 5, wherein
an attachment hole for attaching an optical component is formed in the printed circuit board using a printed circuit board processing means under a state where the printed circuit board processing means is positioned with respect to the LED package, the position being based on a calculation result of the position of the phosphor on the printed circuit board by the image processing means.

7. A position recognition and processing apparatus including the position recognition apparatus for printed circuit board according to claim 4, wherein
an attachment hole for attaching an optical component is formed in the printed circuit board using a printed circuit board processing means under a state where the printed circuit board processing means is positioned with respect to the LED package, the position being based on a calculation result of the position of the phosphor on the printed circuit board by the image processing means.

8. The position recognition apparatus for printed circuit board according to claim 3, wherein
the image processing means calculates positions where a attachment hole is to be formed in the substrate, based on a calculation result of the position of the phosphor and on a calculation result of the angle between the plurality of angle targets.

9. A position recognition and processing apparatus including the position recognition apparatus for printed circuit board according to claim 8, wherein
an attachment hole for attaching an optical component is formed in the printed circuit board using a printed circuit board processing means under a state where the printed circuit board processing means is positioned with respect to the LED package, the position being based on a calculation result of the position of the phosphor on the printed circuit board by the image processing means.

10. A position recognition and processing apparatus including the position recognition apparatus for printed circuit board according to claim 3, wherein
an attachment hole for attaching an optical component is formed in the printed circuit board using a printed circuit board processing means under a state where the printed circuit board processing means is positioned with respect to the LED package, the position being based on a calculation result of the position of the phosphor on the printed circuit board by the image processing means.

11. The position recognition apparatus for printed circuit board according to claim 2, wherein
the image processing means calculates positions where a attachment hole is to be formed in the substrate, based on a calculation result of the position of the phosphor and on a calculation result of the angle between the plurality of angle targets.

12. A position recognition and processing apparatus including the position recognition apparatus for printed circuit board according to claim 11, wherein
an attachment hole for attaching an optical component is formed in the printed circuit board using a printed circuit board processing means under a state where the printed circuit board processing means is positioned with respect to the LED package, the position being based on a calculation result of the position of the phosphor on the printed circuit board by the image processing means.

13. A position recognition and processing apparatus including the position recognition apparatus for printed circuit board according to claim 2, wherein
an attachment hole for attaching an optical component is formed in the printed circuit board using a printed circuit board processing means under a state where the printed circuit board processing means is positioned with respect to the LED package, the position being based on a calculation result of the position of the phosphor on the printed circuit board by the image processing means.

14. A printed circuit board manufacturing method of recognizing a mounting position of an LED package on the printed circuit board, the LED package including a phosphor emitting fluorescence in operation, and forming an attachment hole in the printed circuit board, the printed circuit board manufacturing method comprising:
an imaging step of irradiating the printed circuit board with light containing a blue component, and capturing an image of the printed circuit board via an observation filter configured to transmit blue light of reflected light from the printed circuit board and fluorescence from the phosphor and not to transmit light in a wavelength region longer than a wavelength of the blue light;
a phosphor position calculation step of calculating a position of the phosphor on the printed circuit board, based on image data captured at the imaging step;
an angle target position calculation step of calculating positions of a plurality of angle targets on the printed circuit board, the plurality of angle targets being reference positions in forming the attachment holes for attaching an optical component to the printed circuit board with the optical component adjusted in position with respect to the LED package, to thereby calculate an angle between the plurality of angle targets;
an attachment hole position calculation step of calculating positions where the attachment holes are to be formed in the printed circuit board, based on the position of the phosphor on the printed circuit board at the phosphor position calculation step and on a calculation result of the angle between the plurality of angle targets on the printed circuit board at the angle target position calculation step; and
an attachment hole forming step of forming the attachment holes in the printed circuit board using a printed circuit board processing means, based on a calculation result of the positions of the attachment holes in the printed circuit board at the attachment hole position calculation step.

* * * * *